(12) United States Patent
Kuroda et al.

(10) Patent No.: US 9,153,658 B2
(45) Date of Patent: Oct. 6, 2015

(54) SEMICONDUCTOR DEVICE AND METHOD OF MANUFACTURING THE SAME

(71) Applicant: TOHOKU UNIVERSITY, Miyagi (JP)

(72) Inventors: Rihito Kuroda, Miyagi (JP); Akinobu Teramoto, Miyagi (JP); Shigetoshi Sugawa, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/356,666

(22) PCT Filed: Nov. 16, 2012

(86) PCT No.: PCT/JP2012/079799
§ 371 (c)(1),
(2) Date: May 7, 2014

(87) PCT Pub. No.: WO2013/073671
PCT Pub. Date: May 23, 2013

(65) Prior Publication Data
US 2014/0312399 A1    Oct. 23, 2014

(30) Foreign Application Priority Data

Nov. 17, 2011   (JP) .................................. 2011-251556

(51) Int. Cl.
*H01L 23/58*  (2006.01)
*H01L 29/76*  (2006.01)
*H01L 27/088*  (2006.01)
*H01L 29/66*  (2006.01)
(Continued)

(52) U.S. Cl.
CPC .... *H01L 29/42364* (2013.01); *H01L 21/28008* (2013.01); *H01L 21/28211* (2013.01); *H01L 21/28238* (2013.01); *H01L 21/28273* (2013.01); *H01L 21/302* (2013.01); *H01L 21/30604* (2013.01); *H01L 21/3247* (2013.01); *H01L 21/823857* (2013.01); *H01L 27/092* (2013.01); *H01L 29/1033* (2013.01); *H01L 29/4238* (2013.01); *H01L 29/78* (2013.01); *H01L 29/7881* (2013.01)

(58) Field of Classification Search
None
See application file for complete search history.

(56) References Cited

U.S. PATENT DOCUMENTS 5,926,741 A * 7/1999 Matsuoka et al. ............ 438/778
6,723,666 B1 * 4/2004 En et al. ...................... 438/798
(Continued)

FOREIGN PATENT DOCUMENTS

EP    2 533 270 A1   12/2012
JP    11111674 A  *  4/1999  ............ H01L 21/306
(Continued)

OTHER PUBLICATIONS

International Search Report dated Dec. 18, 2013 for International application No. PCT/JP2012/079799.

*Primary Examiner* — Hoang-Quan Ho
(74) *Attorney, Agent, or Firm* — Morgan, Lewis & Bockius LLP

(57) ABSTRACT

A gate insulating film of a conventional semiconductor device is subjected to dielectric breakdown at a low electric field strength and thus its service life is short. This is because since the size of the asperity of at least one of a semiconductor layer-side interface and an electrode-side interface is large and, an electric field applied to the gate insulating film is locally concentrated and has a variation in its strength. This problem is solved by specifying the sizes of the asperities of both interfaces of the gate insulating film.

7 Claims, 23 Drawing Sheets

(51) Int. Cl.

| | | |
|---|---|---|
| *H01L 29/02* | (2006.01) | |
| *H01L 29/06* | (2006.01) | |
| *H01L 21/336* | (2006.01) | |
| *H01L 21/8234* | (2006.01) | |
| *H01L 21/469* | (2006.01) | |
| *H01L 21/3205* | (2006.01) | |
| *H01L 21/4763* | (2006.01) | |
| *H01L 21/31* | (2006.01) | |
| *H01L 21/8238* | (2006.01) | |
| *H01L 29/423* | (2006.01) | |
| *H01L 27/092* | (2006.01) | |
| *H01L 21/28* | (2006.01) | |
| *H01L 21/324* | (2006.01) | |
| *H01L 29/10* | (2006.01) | |
| *H01L 29/78* | (2006.01) | |
| *H01L 29/788* | (2006.01) | |
| *H01L 21/302* | (2006.01) | |
| *H01L 21/306* | (2006.01) | |
| *H01L 21/70* | (2006.01) | |

(56) References Cited

U.S. PATENT DOCUMENTS

| | | | |
|---|---|---|---|
| 8,445,386 B2 * | 5/2013 | McClure et al. | 438/697 |
| 2003/0045078 A1 * | 3/2003 | Ahn et al. | 438/585 |
| 2003/0119246 A1 * | 6/2003 | Ahn et al. | 438/216 |
| 2004/0108575 A1 * | 6/2004 | Ohmi et al. | 257/627 |
| 2006/0138538 A1 * | 6/2006 | Ohmi et al. | 257/341 |
| 2007/0048989 A1 * | 3/2007 | Ahn et al. | 438/591 |
| 2008/0026553 A1 * | 1/2008 | Chua et al. | 438/591 |
| 2008/0233764 A1 * | 9/2008 | Takahashi et al. | 438/785 |
| 2010/0059830 A1 * | 3/2010 | Ohmi et al. | 257/377 |
| 2014/0097510 A1 * | 4/2014 | Sugawa et al. | 257/432 |
| 2014/0312399 A1 * | 10/2014 | Kuroda et al. | 257/288 |

FOREIGN PATENT DOCUMENTS

| | | | |
|---|---|---|---|
| JP | H11-111674 A | | 4/1999 |
| JP | 2005-093562 A | | 4/2005 |
| JP | 2010-045204 A | | 2/2010 |
| JP | 2010045204 A | * | 2/2010 |
| JP | 2010-050230 A | | 3/2010 |
| WO | 2008/007748 A1 | | 1/2008 |
| WO | 2011/096417 A1 | | 8/2011 |
| WO | WO 2011096417 A1 | * | 8/2011 |

* cited by examiner

SEMICONDUCTOR DEVICE AND METHOD OF MANUFACTURING THE SAME

TECHNICAL FIELD

This invention relates to a semiconductor device and a method of manufacturing the same.

BACKGROUND ART

Higher speed and longer life as well as miniaturization have been required for recent semiconductor devices.

Patent Document 1 proposes a MOS transistor having a source region, a drain region, and a channel region and capable of operating even at a clock frequency of 10 GHz or more by improving the flatness of a surface of the channel region.

Specifically, Patent Document 1 points out that the high-speed operation is accomplished by flattening the surface of the channel region so that the flatness becomes 0.3 nm or less in terms of peak-to-valley (peak to valley) in a range of a length of 2 nm in a direction from the source to the drain.

PRIOR ART DOCUMENT

Patent Document

Patent Document 1: WO2008/007748

SUMMARY OF THE INVENTION

Problem to be Solved by the Invention

However, Patent Document 1 does not take into account the life of the MOS transistor, particularly the life of a gate insulating film, or the electrical withstand voltage of the gate insulating film.

This invention has been made based on an intensive study in view of the points described above and its main object is to provide a semiconductor device which is adapted for miniaturization, higher speed, and longer life.

It is another object of this invention to provide a semiconductor device which can increase the life and electrical voltage withstanding property of a gate insulating film of a MOS transistor, which is capable of high-speed operation, and which is adapted for achieving practical use of a highly-miniaturized, highly-integrated semiconductor integrated circuit device.

Means for Solving the Problem

One aspect of this invention resides in a semiconductor device characterized by comprising a semiconductor layer, an insulating film in direct contact with one surface of the semiconductor layer, and an electrode layer in direct contact with the insulating film on a side opposite to the semiconductor layer, wherein, with respect to an interface between the semiconductor layer and the insulating film and an interface between the insulating film and the electrode layer, asperity, in an arbitrary region of a length of 1 μm along a direction in which the insulating film extends, of each of the interfaces has a size which decreases correspondingly as a thickness of the insulating film decreases.

Another aspect of this invention resides in a semiconductor device characterized in that the size of the asperity of the interface between the semiconductor layer and the insulating film and the size of the asperity of the interface between the insulating film and the electrode layer are each 10% or less of the thickness of the insulating film.

Yet another aspect of this invention resides in a semiconductor device characterized in that the asperities of both interfaces are each a minimum step between atoms in a plane orientation of the semiconductor layer.

Still another aspect of this invention resides in a method of manufacturing a semiconductor device, comprising forming an insulating film on and in contact with a semiconductor layer and forming an electrode layer in contact with the insulating film on a side opposite to the semiconductor layer, wherein, in a manufacturing process, the method includes, at least one or more times, a flattening step of causing asperity of a surface of the semiconductor layer to be 10% or less of a thickness of the insulating film to be formed and further includes a film forming step of forming the insulating film by oxidation, oxynitriding, or nitriding method which causes each of asperity of an interface in contact with the semiconductor layer and asperity of a surface of the insulating film to be 10% or less of the thickness of the insulating film to be formed when the asperity of the surface of the semiconductor layer before forming the insulating film is 10% or less of the thickness of the insulating film to be formed.

A still further aspect of this invention resides in a semiconductor device characterized by comprising
a semiconductor layer,
an insulating film in contact with the semiconductor layer with an interface formed therebetween, and
an electrode layer in contact with the insulating film with an interface formed therebetween on a side opposite to the semiconductor layer,
wherein a thickness of the insulating film, asperity of the interface between the semiconductor layer and the insulating film, and asperity of the interface between the insulating film and the electrode layer are formed so that the asperity of the interface between the semiconductor layer and the insulating film is reflected as it is on the asperity of the interface between the insulating film and the electrode layer.

Effect of the Invention

According to this invention, it is possible to provide a semiconductor device which is adapted for miniaturization, higher speed, and longer life. Further, this invention can also provide a semiconductor device which can increase the life and electrical voltage withstanding property of a gate insulating film of a MOS transistor, which is capable of high-speed operation, and which is adapted for achieving practical use of a highly-miniaturized, highly-integrated semiconductor integrated circuit device.

Further, according to this invention, with respect to an interface between a semiconductor layer and an insulating film and an interface between the insulating film and an electrode layer, asperity, in an arbitrary region of a length of 1 μm along a direction in which the insulating film extends, of each of the interfaces has a size which decreases correspondingly as a thickness of the insulating film decreases. Therefore, it is possible to reduce the electric field strength locally concentrated on the insulating film and thus to provide a semiconductor device having high breakdown electric field strength and long life.

Still further, according to this invention, a thickness of an insulating film, asperity of an interface between a semiconductor layer and the insulating film, and asperity of an interface between the insulating film and an electrode layer are formed so that the asperity of the interface between the semiconductor layer and the insulating film is reflected as it is on the asperity of the interface between the insulating film and the electrode layer. Therefore, the insulating film has high electrical voltage withstanding property and long life so that it is possible to provide a highly-miniaturized, highly-integrated semiconductor integrated circuit device capable of high-speed operation.

Furthermore, according to this invention, since asperity of an interface, in contact with a semiconductor layer, of a gate insulating film and asperity of an interface, in contact with a gate electrode, of the gate insulating film are each 10% or less of a thickness of the gate insulating film in a region of a length of 1 μm in a direction parallel to the interface. Therefore, it is possible to reduce the electric field strength locally concentrated on the gate insulating film and the semiconductor layer and thus high breakdown electric field strength and long life can be obtained.

Moreover, according to this invention, there is obtained a gate insulating film excellent in initial yield and long-term reliability.

MODE FOR CARRYING OUT THE INVENTION

Before describing embodiments of this invention, the technical approach to this invention will be described hereinbelow for better understanding of this invention.

In view of the above-mentioned objects, the present inventors have reviewed the interface structure of a gate insulating film of a conventional semiconductor device in the following manner.

Figure 1:
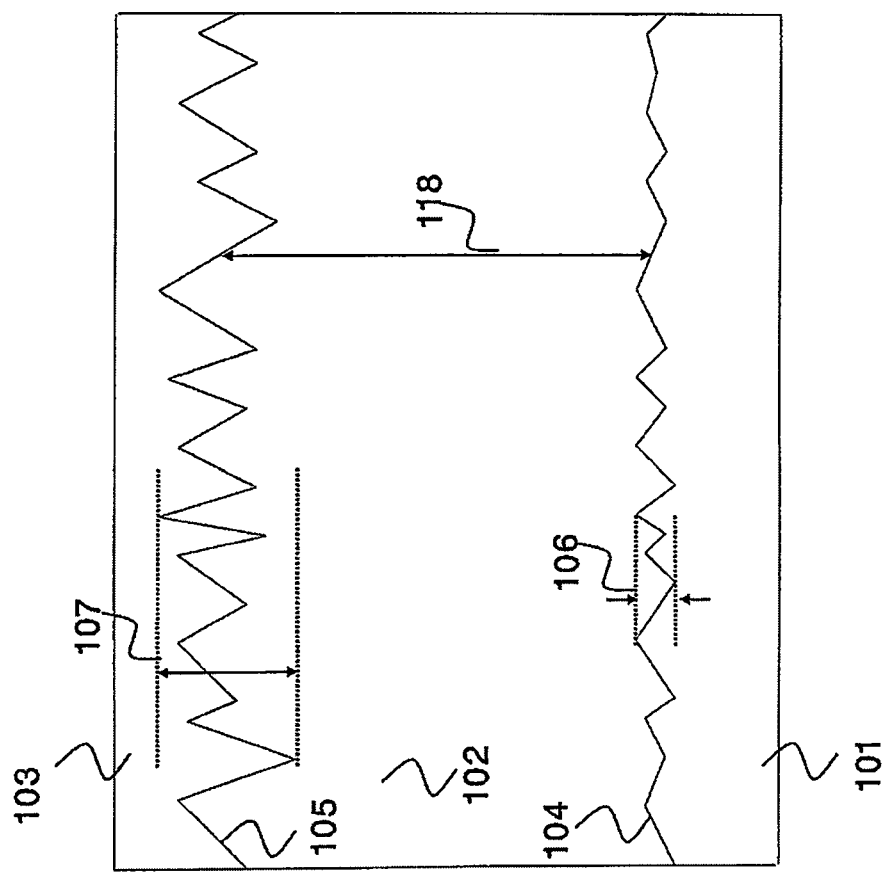
FIG. 1 is an exemplary cross-sectional view for explaining a conventional gate insulating film formed by oxygen radical oxidation, wherein the asperity of a semiconductor layer-side interface and the asperity of an electrode-side interface are each greater than 10% of the thickness of the gate insulating film.

FIG. 1 shows a cross-sectional view of one example of a conventional gate insulating film.

First, there was prepared a commercially available silicon wafer with a semiconductor layer 101 made of silicon (Si) and having a surface with a (100) orientation. The surface of the semiconductor layer 101 of the silicon wafer in the state at the time of the purchase was cleaned by an ordinary semiconductor cleaning method and then the surface of the semiconductor layer 101 cleaned at 400° C. thereafter was oxidized by a radical oxidation method (the silicon surface was directly oxidized by oxygen radicals formed in plasma), thereby forming a gate insulating film 102 with an average thickness of 6 nm.

Thereafter, an electrode 103 was formed on the gate insulating film 102 by an electrode forming technique used in the general semiconductor field.

In this invention, for convenience' sake, an interface 104 between the semiconductor layer 101 and the gate insulating film 102 may also be referred to as a "semiconductor layer-side interface 104" and an interface 105 between the gate insulating film 102 and the electrode 103 may also be referred to as an "electrode-side interface 105".

The size of asperity 106 of the semiconductor layer-side interface 104 and the size of asperity 107 of the electrode-side interface 105 were respectively measured.

The maximum values of the sizes of the asperity 106 of the semiconductor layer-side interface 104 and the asperity 107 of the electrode-side interface 105 each in an arbitrary region of a length (L) of 1 μm along a direction in which the insulating film 102 extends (the left-right direction of the sheet surface) were respectively 0.9 nm and 1.2 nm in terms of peak-to-valley (peak to valley).

50 silicon wafers were processed by the same techniques and sequence and the sizes of asperities 106 of semiconductor layer-side interfaces 104 and the sizes of asperities 107 of electrode-side interfaces 105 were respectively measured in the same manner.

As a result, the present inventors have obtained new knowledge shown below. According to the knowledge, the size of the asperity of the semiconductor layer surface before the oxidation appears almost as it is as the size of the asperity of the interface 105 between the oxide film (insulating film) 102 and the electrode 103.

In contrast to this, the size of the asperity of the interface 104 between the semiconductor layer 101 and the oxide film 102 becomes smaller, due to the radical oxidation, than the size of the asperity of the semiconductor layer surface before the oxidation, so that the degree of the asperity is reduced.

That is, the size of the asperity 107 of the electrode-side interface 105 substantially reflects the size of the asperity of the surface of the semiconductor layer 101 before the oxidation while the size of the asperity 106 of the semiconductor layer-side interface 104 becomes smaller as illustrated in the figure because the original asperity size is reduced through the radical oxidation process.

According to experiments by the present inventors, this effect is obtained even by thermal oxidation. That is, if the original surface flatness (average roughness) Ra of a semiconductor layer is greater than 0.1 nm, the size of the asperity tends to decrease even by thermal oxidation. However, the size of the asperity tends to decrease more significantly by radical oxidation than by thermal oxidation.

On the other hand, if the original surface flatness Ra of a semiconductor layer is 0.1 nm or less, the size of the interface asperity becomes greater than that of the original asperity by thermal oxidation while it is substantially unchanged by radical oxidation.

In terms of the example described so far with reference to FIG. 1 (0.9 nm for the asperity 106 of the semiconductor layer-side interface 104 and 1.2 nm for the asperity 107 of the electrode-side interface 105), if, for example, an (average) thickness 118 of the gate insulating film 102 is 6 nm, the size of the interface asperity accounts for 15% to 20% of the (average) thickness 118 of the gate insulating film 102.

Further, the thickness of a gate insulating film is decreasing even currently for improving the low-voltage driving and switching speed of a transistor to be formed and this tendency is said to continue also in the future.

Under these circumstances, a MOS transistor having a gate insulating film with a thickness of 2 nm has also been proposed. In this case, the size of the interface asperity reaches as much as 45% to 60% of the thickness of the gate insulating film.

In the meantime, herein, the reason for describing the thickness 118 as an "average thickness" is that since the semiconductor layer-side interface 104 and the electrode-side interface 105 of the gate insulating film 102 are each irregular and uneven and thus a measured value of the thickness of the gate insulating film 102 depends on location, the average value of a plurality of measured values in a range of a length (L) of the gate insulating film 102 is defined as the thickness of the gate insulating film 102 for convenience' sake in this invention.

Further, in this invention, an imaginary surface on the semiconductor layer 101 side of the gate insulating film 102 whose thickness is given by the average thickness and an imaginary surface on the electrode 103 side thereof may also be referred to as a "first main surface" and a "second main surface", respectively.

Figure 2:
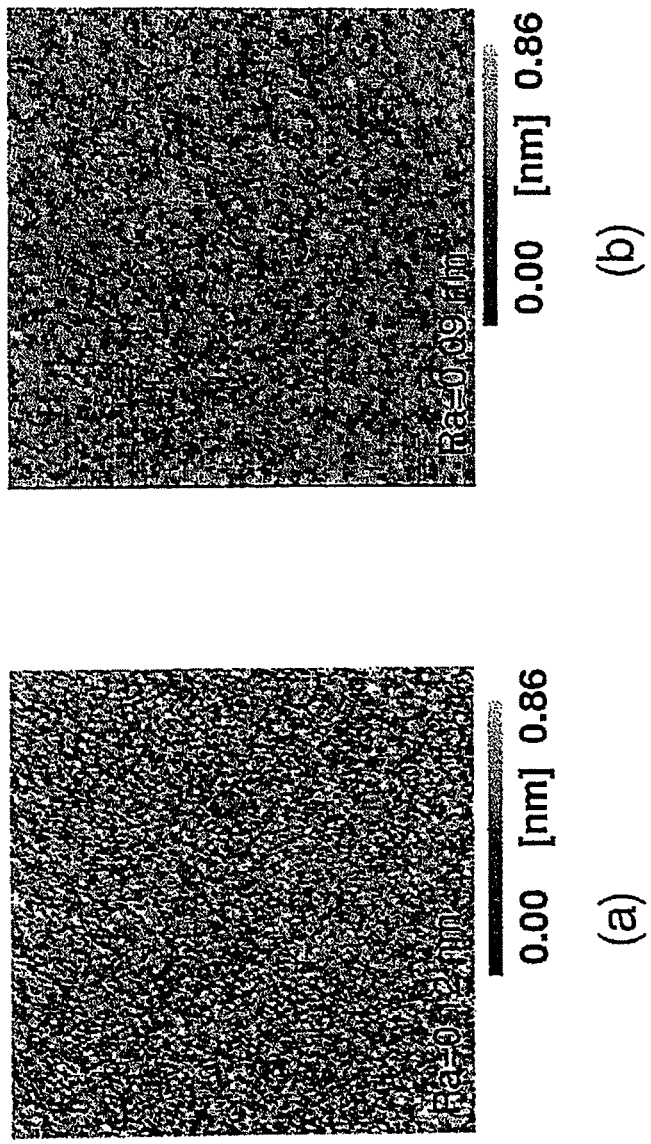
FIG. 2 shows atomic force microscopy images of a semiconductor layer-side interface and an insulating film surface of a conventional gate insulating film formed by oxygen radical oxidation, wherein the asperity of the semiconductor layer-side interface and the asperity of the electrode-side interface are each greater than 10% of the thickness of the gate insulating film.

FIGS. 2 (a) and (b) respectively show examples of atomic force microscopy images of an electrode-side interface and a semiconductor layer-side interface (the example of FIG. 1).

In terms of an average roughness Ra defined by the following formula 1, the electrode-side interface is 0.12 nm while the semiconductor layer-side interface is 0.09.

[Formula 1]

$$R_a = \frac{1}{A} \cdot \int_{Y_1}^{Y_2} \int_{X_1}^{X_2} |Z(x, y) - Z_{Ave}| \, dx \, dy \qquad (1)$$

Herein, $Z(x,y)$, $Z_{Ave}$, and $A$ respectively represent a height at a position $(x,y)$, an average height, and the number of measurement points.

Figure 3:
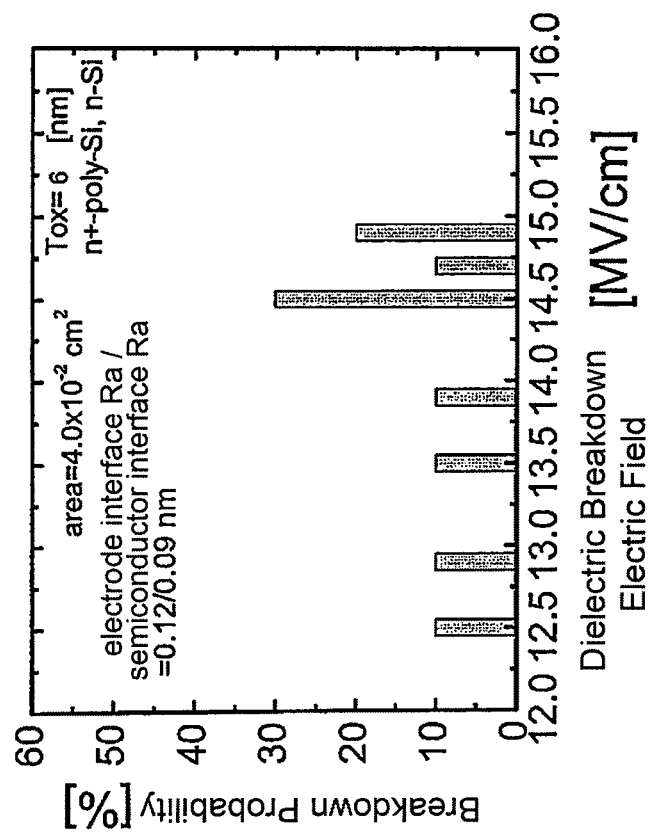
FIG. 3 is a diagram showing the relationship between the dielectric breakdown electric field strength and the breakdown probability of a conventional gate insulating film with an area of $4.0 \times 10^{-2}$ cm$^2$ formed by oxygen radical oxidation, wherein the asperity of a semiconductor layer-side interface and the asperity of an electrode-side interface are each greater than 10% of the thickness of the gate insulating film.
Figure 4:
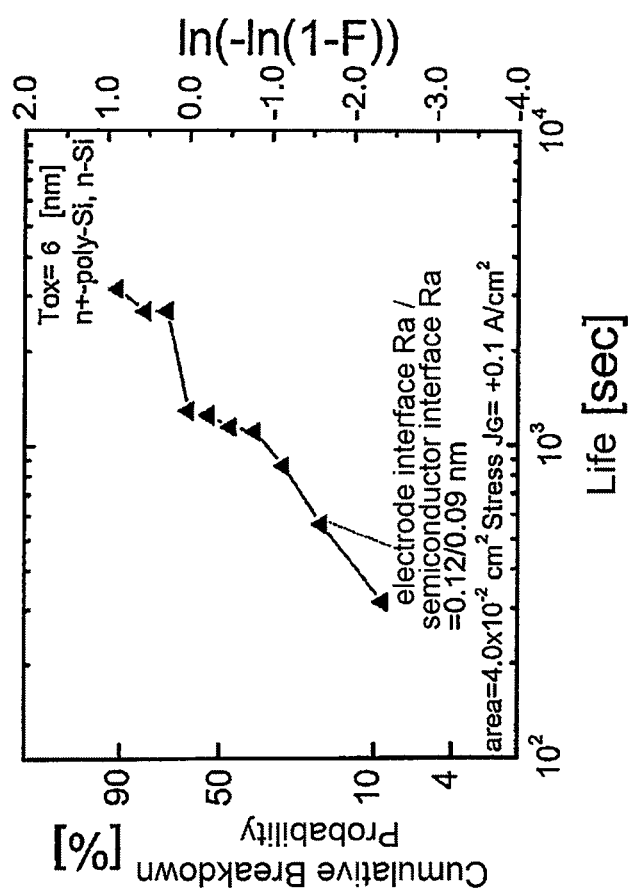
FIG. 4 is a diagram showing the cumulative probability of the life of a conventional gate insulating film with an area of $4.0 \times 10^{-2}$ cm$^2$ formed by oxygen radical oxidation when a constant stress current of +0.1 A/cm$^2$ is applied thereto, wherein the asperity of a semiconductor layer-side interface and the asperity of an electrode-side interface are each greater than 10% of the thickness of the gate insulating film.

FIGS. 3 and 4 respectively show an example of the relationship between the dielectric breakdown electric field and the breakdown probability of a gate insulating film composed of a silicon oxide film with a thickness of 6 nm formed by radical oxidation using oxygen radicals at 400° C. and an example of the cumulative probability of the life when a constant current stress of +0.1 A/cm$^2$ is applied to the gate insulating film (the example of the gate insulating film of FIG. 1).

According to this example, it is seen that when an electric field is applied to the gate insulating film, local electric field concentration occurs due to the asperity of a semiconductor layer-side interface and the asperity of an electrode-side interface so that there are places where the electric field strength becomes locally high.

From many experimental results, the present inventors have considered that this causes the breakdown electric field strength of the gate insulating film to be low, causes the life of the gate insulating film to be short when the constant current stress is applied thereto, or causes experimental values thereof to be varied. According to the data shown in FIG. 3, as many as 30% of the gate insulating films are broken by a dielectric breakdown electric field of 13.5 MV/cm or less.

Further, as shown in FIG. 4, it is seen that as many as 30% of the gate insulating films are broken in $1 \times 10^3$ seconds or less when a current of +0.1 A/cm$^2$ is applied thereto.

The present inventors have confirmed from experimental results that the gate insulating film of the semiconductor device described in Patent Document 1 also shows the same tendency as described above.

Figure 5:
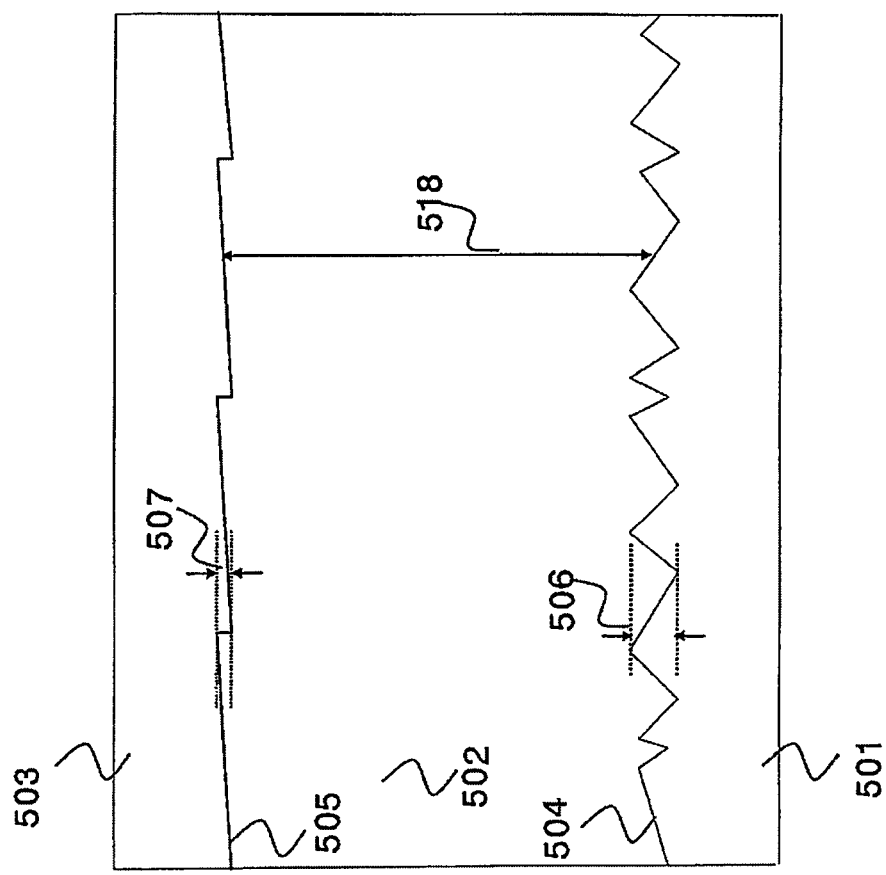
FIG. 5 is an exemplary cross-sectional view for explaining a conventional gate insulating film formed by oxygen radical oxidation, wherein the asperity of a semiconductor layer-side interface is greater than 10% of the thickness of the gate insulating film.

FIG. 5 shows an exemplary cross-sectional view of another example of a conventional gate insulating film.

A surface, with a (100) orientation, of a semiconductor layer 501 made of Si was annealed at a high temperature in an Ar atmosphere to be flattened to approximately a minimum step between atoms and then was subjected to thermal oxidation (water oxidation), thereby forming an illustrated gate insulating film 502 to a thickness of 6 nm. This insulating film 502 has a semiconductor layer-side interface 504 between itself and the semiconductor layer 501 and an electrode-side interface 505 between itself and a gate electrode 503 on the side opposite to the semiconductor layer 501.

The size of asperity 506 of the semiconductor layer-side interface 504 and the size of asperity 507 of the electrode-side interface 505 are respectively 0.8 nm and 0.14 nm in a region of a length of 1 μm according to the foregoing definition.

As seen from FIG. 5, the asperity 507 of the electrode-side interface 505 reflects the flatness of the silicon surface before the oxidation (the original surface of the semiconductor layer 502) and thus maintains the minimum step between Si atoms while the asperity 506 of the semiconductor layer-side interface 504 is increased in size by the thermal oxidation.

Since an average thickness 518 of the gate insulating film 502 is 6 nm, the size of the asperity 506 of the semiconductor layer-side interface 504 is 13.3% of the average thickness 518 of the gate insulating film.

On the other hand, the size of the asperity 507 of the electrode-side interface 505 is the size of the minimum step between Si atoms in the (100) orientation and is 2.3% of the average thickness 518 of the gate insulating film 502.

Figure 6:
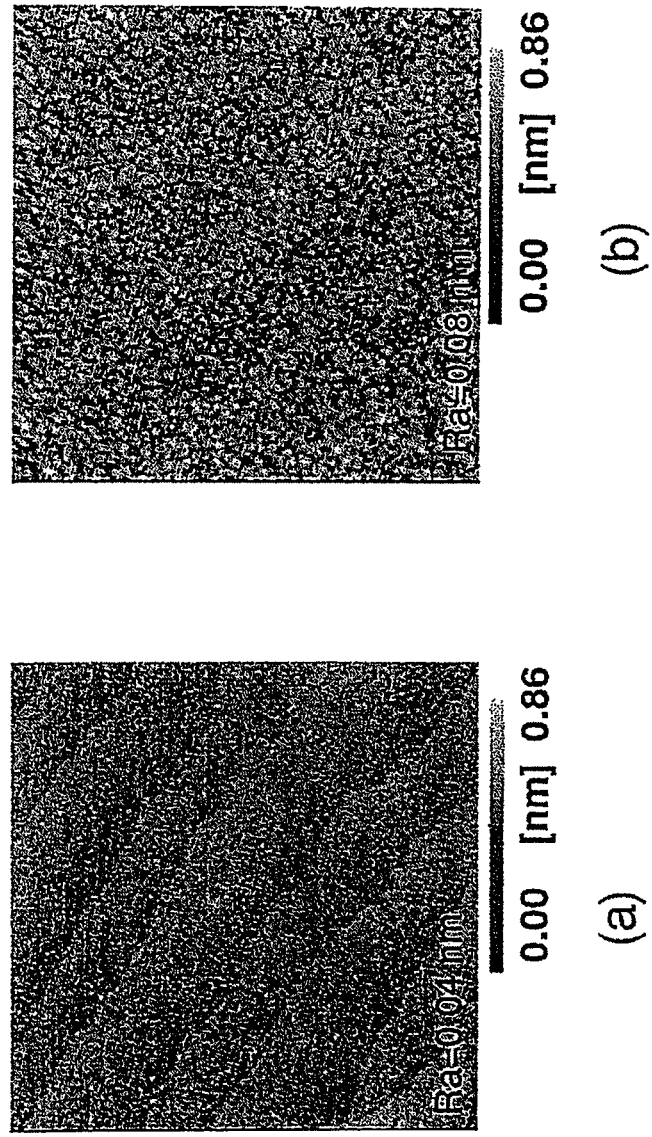
FIG. 6 is diagrams showing atomic force microscopy images, with average roughness (Ra), of a semiconductor layer-side interface and an insulating film surface of a conventional gate insulating film formed by oxygen radical oxidation, wherein the asperity of the semiconductor layer-side interface is greater than 10% of the thickness of the gate insulating film.

FIGS. 6 (a) and (b) respectively show other examples of atomic force microscopy images of an electrode-side interface and a semiconductor layer-side interface.

The average roughness Ra of the electrode-side interface and that of the semiconductor layer-side interface are 0.04 nm and 0.08 nm, respectively.

Herein, the lower limit of an average roughness Ra measured by an atomic force microscope is determined by the noise signal intensity of a measuring apparatus and it is currently about 0.04 nm. That is, even if an interface whose average roughness Ra is actually smaller than 0.04 nm is measured, Ra measured by the atomic force microscope becomes 0.04 nm or so.

Figure 7:
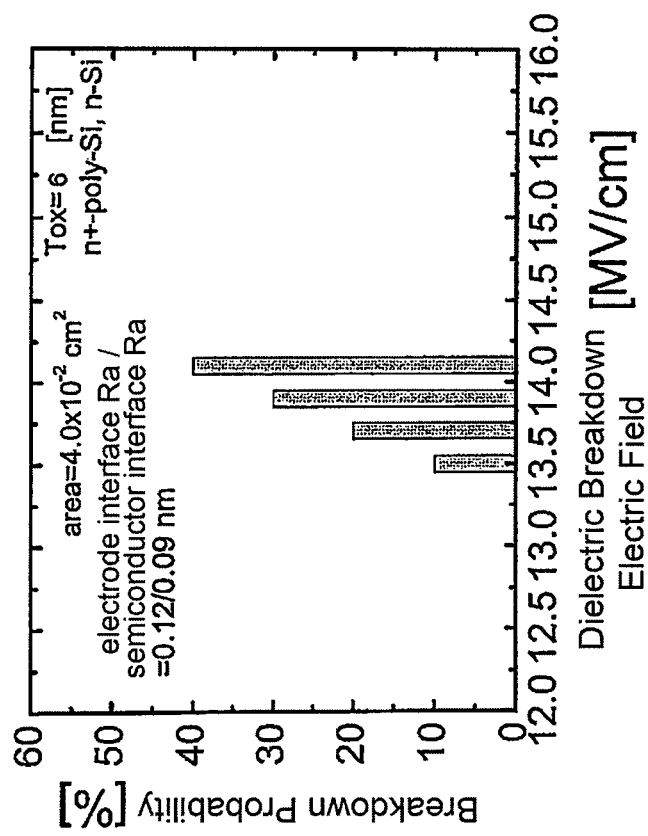
FIG. 7 is a diagram showing the relationship between the dielectric breakdown electric field strength and the breakdown probability of a conventional gate insulating film with an area of $4.0 \times 10^{-2}$ cm$^2$ formed by oxygen radical oxidation, wherein the asperity of a semiconductor layer-side interface is greater than 10% of the thickness of the gate insulating film.
Figure 8:
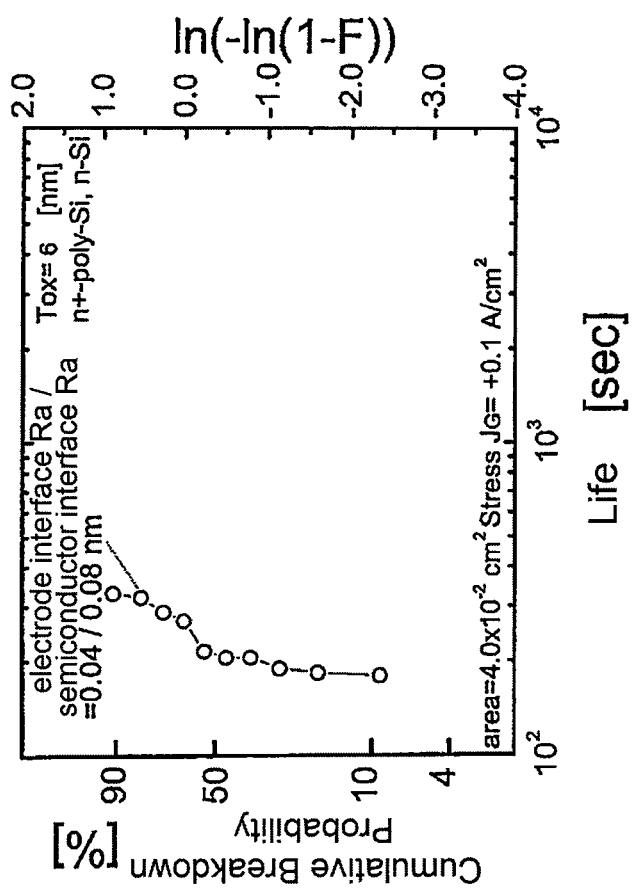
FIG. 8 is a diagram showing the cumulative probability of the life of a conventional gate insulating film with an area of $4.0 \times 10^{-2}$ cm$^2$ formed by oxygen radical oxidation when a constant stress current of +0.1 A/cm$^2$ is applied thereto, wherein the asperity of a semiconductor layer-side interface is greater than 10% of the thickness of the gate insulating film.

FIGS. 7 and 8 respectively show another example of the relationship between the dielectric breakdown electric field and the breakdown probability of a gate insulating film in the form of a silicon oxide film with a thickness of 6 nm formed by water oxidation at 750° C. and another example of the cumulative probability of the life when a constant current stress of +0.1 A/cm$^2$ is applied to the gate insulating film (the example of the gate insulating film shown in FIG. 5).

As shown in FIG. 7, as many as 10% of the samples are broken by a dielectric breakdown electric field of 13.5 MV/cm and almost all the samples are broken by a dielectric breakdown electric field of about 14.2 MV/cm.

From FIG. 8, it is seen that almost all the gate insulating films (almost all the samples) are broken in $4 \times 10^2$ seconds or less when a current of +0.1 A/cm$^2$ is applied thereto.

From this, it is considered that even if the size of the asperity 507 of the electrode-side interface 505 is the minimum step size between silicon (Si) atoms, in the (100) orientation, of the surface of the semiconductor layer 501, when the size of the asperity 506 of the semiconductor layer-side interface 504 is greater than 10% of the thickness of the insulating film 502, electric field concentration occurs locally due to the size of the asperity 506 of the semiconductor layer-side interface 504 so that there are places where the electric field strength becomes locally high.

This is considered to cause the breakdown electric field strength of the gate insulating film to be low, cause the life of the gate insulating film to be short when the constant current stress is applied thereto, or cause measured values thereof to be varied.

This invention has been made in the light of the knowledge based on the review described above.

One of the main requirements of this invention is that the sizes of the asperities of both interfaces of a gate insulating film of an electronic element such as a transistor are each 10% or less of the thickness of the gate insulating film.

More specifically, the feature of this invention is that the sizes of all asperities on a front surface (electrode-side interface) and the sizes of all asperities on a back surface (semiconductor layer-side interface), each defined by the length (the left-right direction of the sheet surface if shown in the example of FIG. 1) and the width (the depth direction of the sheet surface if shown in the example of FIG. 1), of a formed gate insulating film are each 10% or less of the average thickness of the gate insulating film.

More preferably, it is desirable that the sizes of the asperities of both interfaces each be the size of the minimum step between atoms in the plane orientation of the semiconductor layer.

Figure 21:
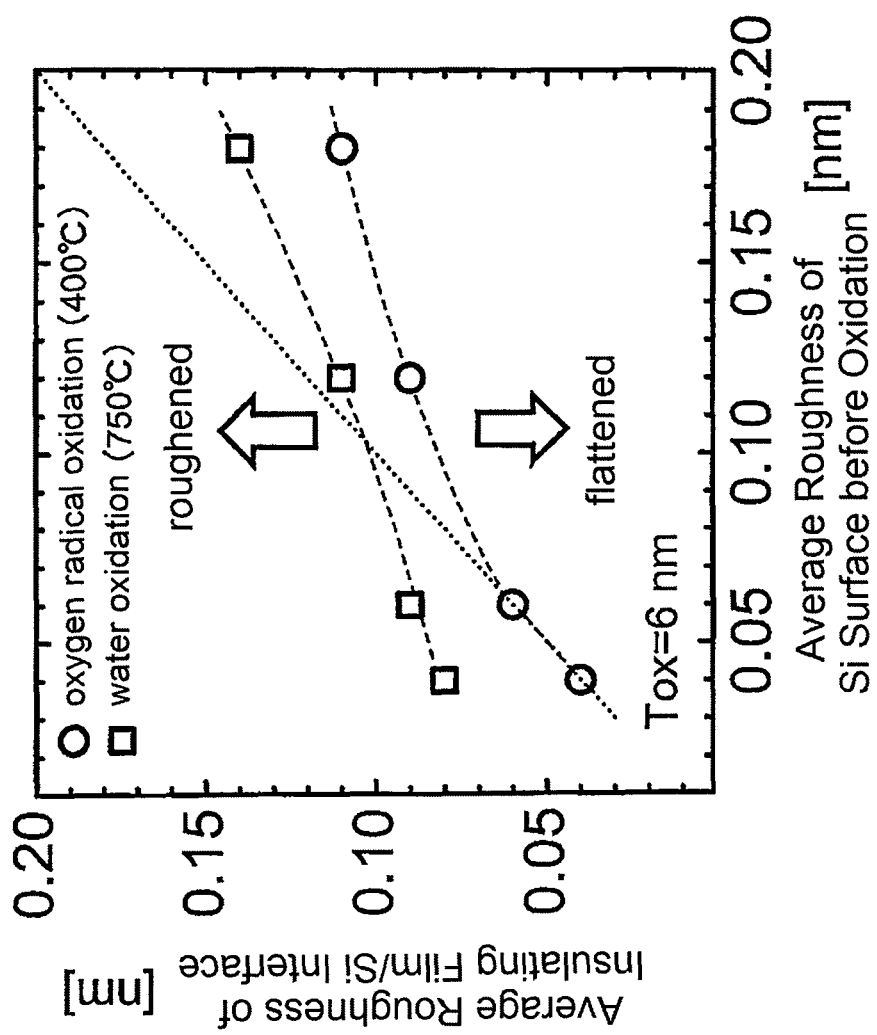
FIG. 21 is a diagram showing the relationship between the average roughness (Ra) of a semiconductor layer surface before oxidation and the average roughness (Ra) of an interface between an insulating film and the semiconductor layer.

FIG. 21 shows measurement results of the average roughness Ra of a Si semiconductor layer surface before oxidation and the average roughness Ra of an insulating film/semiconductor layer interface (semiconductor layer-side interface).

As described before, the average roughness Ra of the Si semiconductor layer surface before the oxidation is approximately equal to the average roughness Ra of an interface between the insulating film and an electrode (electrode-side interface).

FIG. 21 shows a case where an insulating film having a thickness of 6 nm in terms of a silicon oxide film was formed by oxygen radical oxidation and a case where the same was formed by water oxidation (thermal oxidation using water).

In these examples, the oxidation was carried out at 400° C. and 750° C., respectively.

As indicated by ○ marks in FIG. 21, it is seen that, in the case of the radial oxidation, when the average roughness Ra of the Si semiconductor layer surface before the oxidation is 0.10 nm or less, the average roughness Ra of the insulating film/Si semiconductor layer interface (semiconductor layer-side interface) is equal to the average roughness Ra of the Si semiconductor layer surface before the oxidation.

When the average roughness Ra of the Si semiconductor layer surface before the oxidation exceeds 0.10 nm, the average roughness Ra of the insulating film/Si semiconductor layer interface (semiconductor layer-side interface) is considerably reduced as compared to the original average roughness Ra of the Si semiconductor layer surface before the oxidation.

On the other hand, as indicated by □ marks in FIG. 21, it is seen that, in the case of the water oxidation, when the average roughness Ra of the Si semiconductor layer surface before the oxidation is 0.10 nm or less, the average roughness Ra of the insulating film/Si semiconductor layer interface (semiconductor layer-side interface) is greater than the original average roughness Ra of the Si semiconductor layer surface before the oxidation.

It is seen that when the average roughness Ra of the Si semiconductor layer surface before the oxidation exceeds 0.10 nm, the average roughness Ra of the insulating film/Si semiconductor layer interface (semiconductor layer-side interface) is reduced as compared to the original average roughness Ra of the Si semiconductor layer surface before the oxidation.

Figure 22:
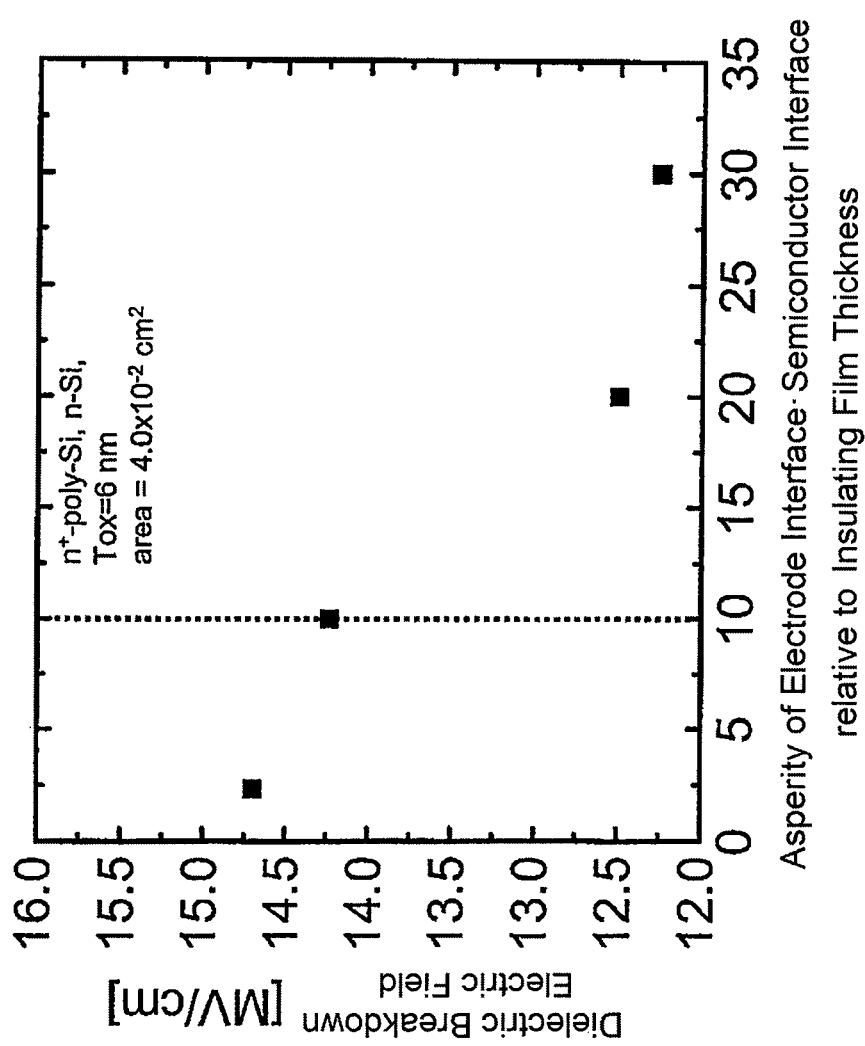
FIG. 22 is a graph showing the relationship between the ratio (%) of the asperity of each of an electrode interface and a semiconductor interface to the thickness of an insulating film and the dielectric breakdown electric field.

FIG. 22 shows the relationship between the ratio (%) of the size of the asperity of each of an electrode-side interface and a semiconductor layer-side interface to the thickness of an insulating film and the dielectric breakdown electric field (MV/cm). As samples for the measurement, there were prepared 10 gate insulating films each having a size with a film area of $4.0 \times 10^{-2}$ cm$^2$ by oxygen radical oxidation and each capable of being subjected to electrical measurement.

As a dielectric breakdown voltage value, the minimum value was employed among measured values.

As is also clear from FIG. 22, when the ratios (%) of the asperity of the semiconductor-side interface and the asperity of the electrode-side interface to the thickness of the gate insulating film each exceed 10% and reach 20%, the minimum value of the dielectric breakdown electric field is 12.5 MV/cm. When they reach 30%, it is 12.5 MV/cm or less.

On the other hand, when the ratios (%) of the asperity of the semiconductor-side interface and the asperity of the electrode-side interface to the thickness of the gate insulating film are each 10% or less, the minimum value of the dielectric breakdown electric field reaches 14.25 MV/cm to 14.75 MV/cm (electrical voltage withstanding property is high). From this point, it is understood that the dielectric breakdown electric field value changes critically and significantly when the ratios (%) of the asperity of the semiconductor-side interface and the asperity of the electrode-side interface to the thickness of the gate insulating film are each 10%.

Figure 23:
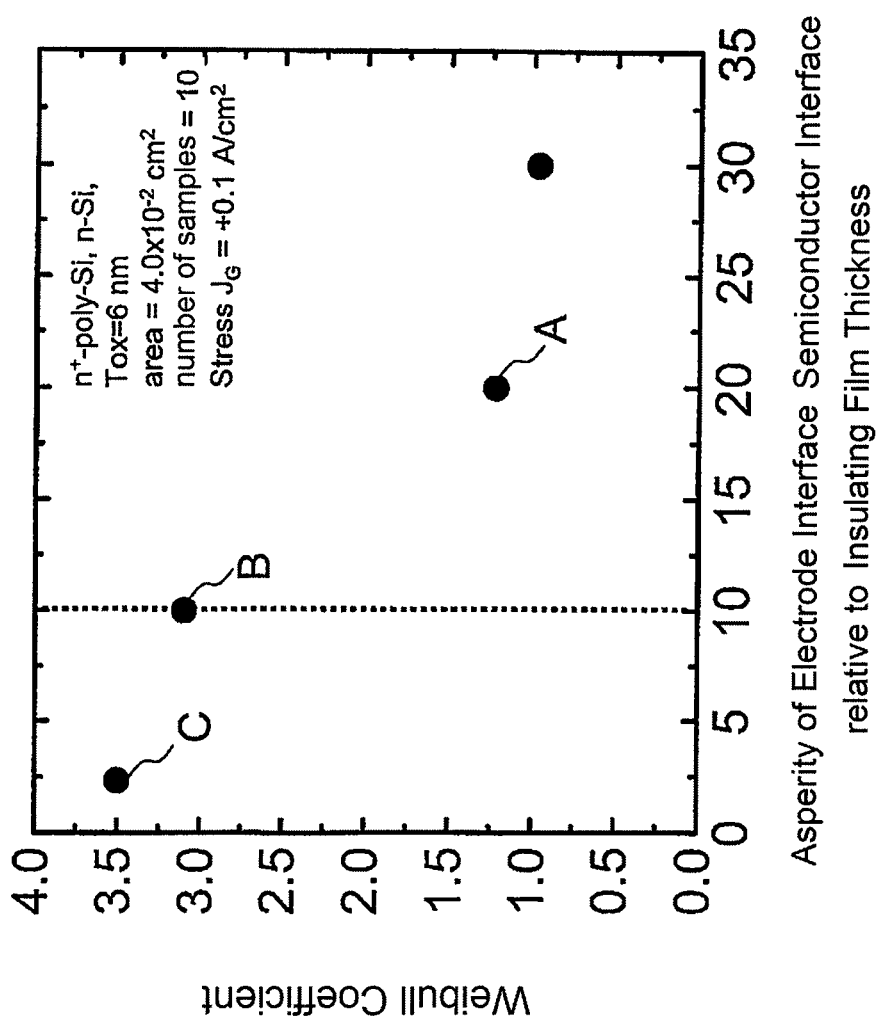
FIG. 23 is a diagram showing the relationship between the ratio (%) of the asperity of each of an electrode-side interface and a semiconductor layer-side interface to the thickness of an insulating film and the Weibull coefficient.

FIG. 23 shows the relationship between the ratio (%) of the asperity of each of a semiconductor-side interface and an electrode-side interface to the thickness of a gate insulating film (insulating film area is $4.0 \times 10^{-2}$ cm$^2$) and the Weibull coefficient extracted from a range where the cumulative probability of the life of the gate insulating film when a constant stress current of +0.1 A/cm$^2$ is applied thereto is 40% or less.

Herein, the Weibull coefficient is an index indicating variation of life until dielectric breakdown, wherein as its value decreases, it represents that variation is greater and that the breakdown probability to dielectric breakdown is higher in a range where the life is short.

Figure 12:
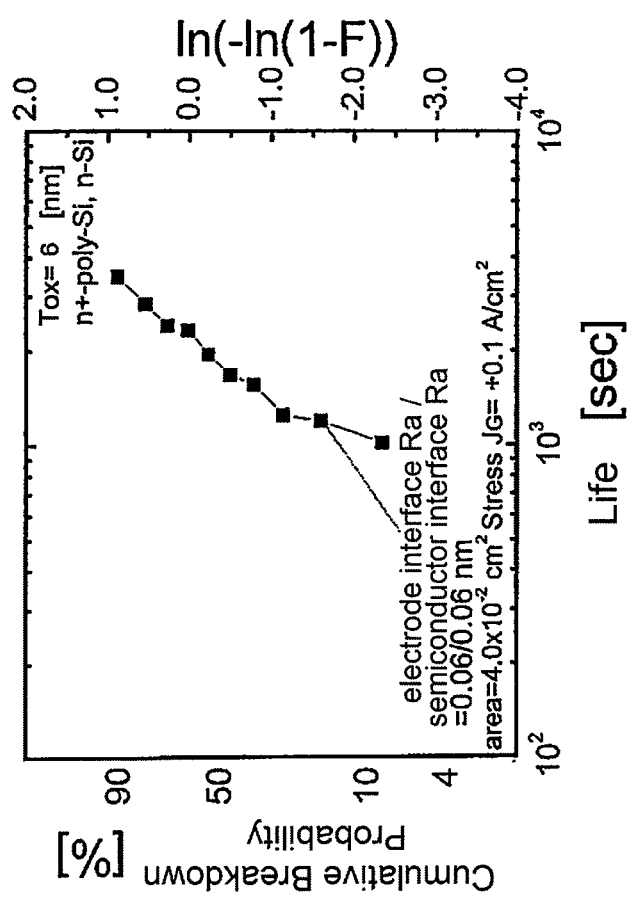
FIG. 12 is a diagram showing the cumulative probability of the life of the gate insulating film with an area of $4.0 \times 10^{-2}$ cm$^2$ according to the first embodiment of this invention when a constant stress current of +0.1 A/cm$^2$ is applied thereto.
Figure 17:
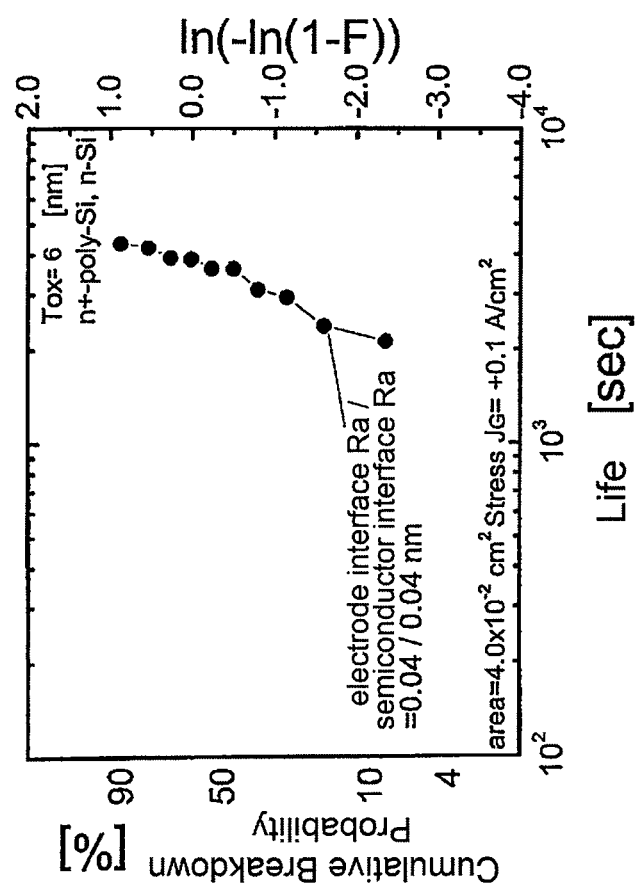
FIG. 17 is a diagram showing the cumulative probability of the life of the gate insulating film according to the second embodiment of this invention when a constant stress current of +0.1 A/cm$^2$ is applied thereto.

In FIG. 23, a Weibull coefficient of the example shown in FIG. 4 is shown at point A, a Weibull coefficient of an example shown in FIG. 12 is shown at point B, and a Weibull coefficient of an example shown in FIG. 17 is shown at point C.

As shown in FIG. 23, it is seen that when the abovementioned asperity ratios to the thickness of the insulating film are each greater than 10%, the Weibull coefficient is as low as about 1 or less. On the other hand, when the abovementioned asperity ratios to the thickness of the insulating film each become 10% or less, the Weibull coefficient rapidly increases to 3 or more.

Also from this, it is seen that when the ratios of the asperity of the semiconductor-side interface and the asperity of the electrode-side interface to the thickness of the gate insulating film are each 10% or less, the breakdown probability to dielectric breakdown becomes small in a range where the life is short.

As described above, also from the Weibull coefficients shown in FIG. 23, it is seen that the ratios of the asperity of the semiconductor-side interface and the asperity of the electrode-side interface to the thickness of the gate insulating film each being 10% has a critical meaning.

In this invention, the semiconductor layer may be single-crystalline, polycrystalline, or amorphous and its constituent material is selected from semiconductor materials such as Si (silicon), SiGe$_x$ (silicon germanium) (0<x<1), Ge (germanium), GaAs (gallium arsenide), GaN (gallium nitride), SiC (silicon carbide), and InP (indium phosphorus).

A gate insulating film manufacturing method of this invention comprises forming an insulating film on and in contact with a semiconductor layer and forming an electrode layer on and in direct contact with the insulating film, wherein, in a manufacturing process, the method includes, at least one or more times, a flattening step of causing the size of the asperity of a surface of the semiconductor layer to be 10% or less of the thickness of the insulating film to be formed.

Thereafter, the surface of the semiconductor layer is oxidized, oxynitrided, or nitrided so that the size of the asperity of a semiconductor layer-side interface to be formed becomes 10% or less of the thickness of the insulating film to be formed, thereby forming the insulating film on the semiconductor layer.

The flattening step may include a step of forming an insulating film (insulating oxide film) by oxidizing the surface of the semiconductor layer in an atmosphere of water or oxygen or in a mixed atmosphere of water and oxygen at a temperature of 900° C. or more, and then removing unnecessary part, for an electronic element to be formed, of the insulating film using a chemical solution containing hydrofluoric acid.

Alternatively, the flattening step may include a step of carrying out a heat treatment in an atmosphere of Ar (argon), H$_2$ (hydrogen), or Ar/H$_2$ (argon/hydrogen) at 800° C. or more after removing a natural oxide film of the surface of the semiconductor layer.

Preferably, the insulating film forming step includes an isotropic oxidation, oxynitriding, or nitriding step in which the film forming rate does not depend on the difference in plane orientation of the semiconductor layer, such as, for example, an oxidation step using oxygen radicals, a nitriding step using nitrogen radicals, or an oxynitriding step using a mixture of oxygen radicals and nitrogen radicals or NH radicals.

The insulating film forming step may include a film forming step of depositing an insulating film containing any of Hf (hafnium), La (lanthanum), Ti (titanium), Al (aluminum), O (oxygen), Si (silicon), Pr (praseodymium), and N (nitrogen).

A MOS transistor according to this invention is characterized by comprising a semiconductor layer, a gate insulating film provided directly on the semiconductor layer, and a gate electrode layer provided directly on the gate insulating film, wherein all asperities of an interface between the semiconductor layer and the gate insulating film and all asperities of an interface between the gate insulating film and the gate electrode layer each have a size which decreases correspondingly as the thickness of the gate insulating film decreases in an arbitrary region of a length of 1 μm in a direction parallel to an extending direction of the gate insulating film.

In the MOS transistor according to this invention, the polarity of the channel may be either n-type or p-type.

All MOS transistors in a CMOS circuit according to this invention each have the same structure as the above-mentioned MOS transistor.

Hereinbelow, embodiments of this invention will be described with reference to the drawings.

First Embodiment

Figure 9:
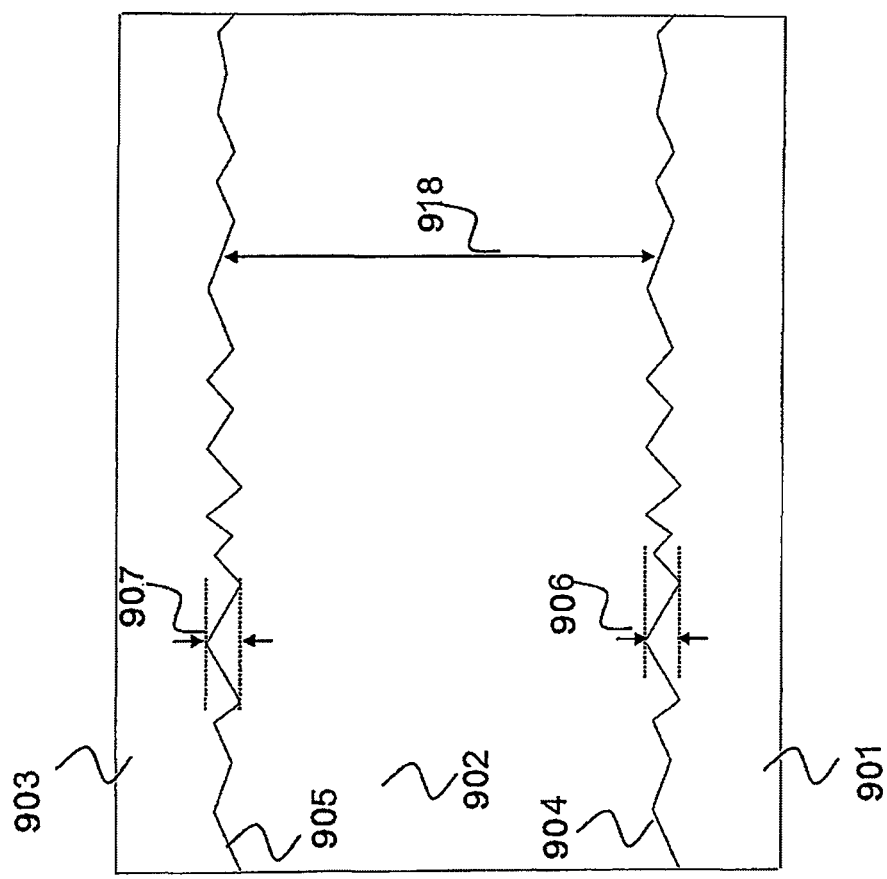
FIG. 9 is an exemplary cross-sectional view for explaining a gate insulating film according to a first embodiment of this invention.

FIG. 9 shows an exemplary cross-sectional view of a gate insulating film according to a first embodiment of this invention.

Figure 10:
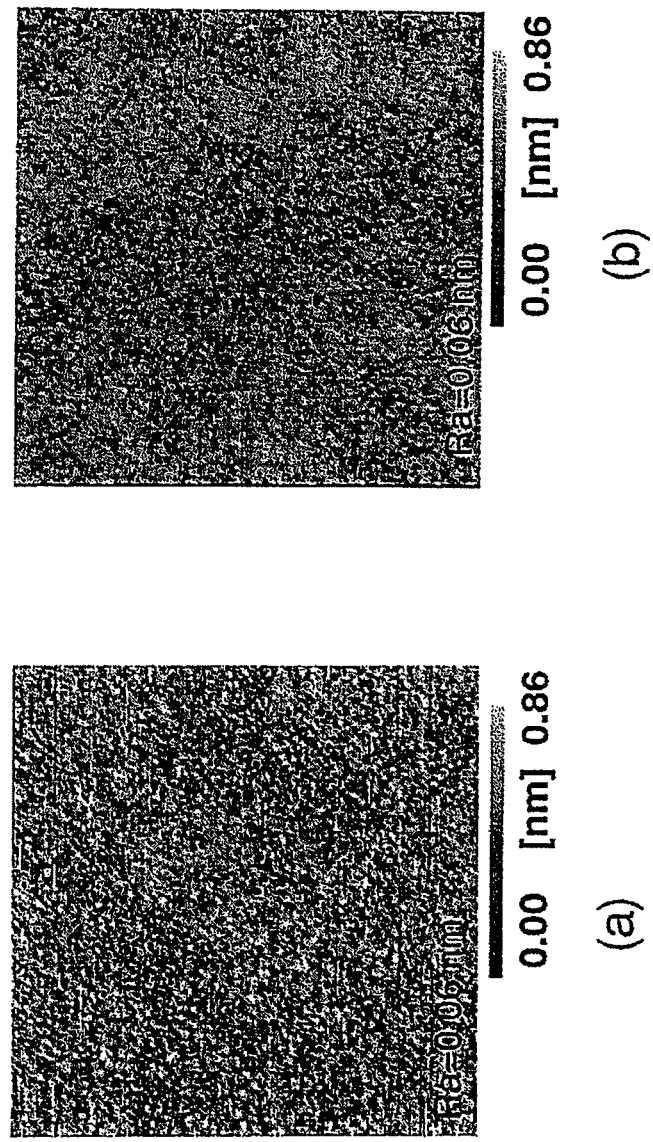
FIG. 10 is diagrams showing atomic force microscopy images, with average roughness (Ra), of a semiconductor layer-side interface and an insulating film surface of the gate insulating film according to the first embodiment of this invention.

FIGS. 10 (a) and (b) respectively show atomic force microscopy images of a semiconductor layer-side interface of the gate insulating film and a surface (surface on the side opposite to the semiconductor layer-side interface) of the gate insulating film.

Figure 11:
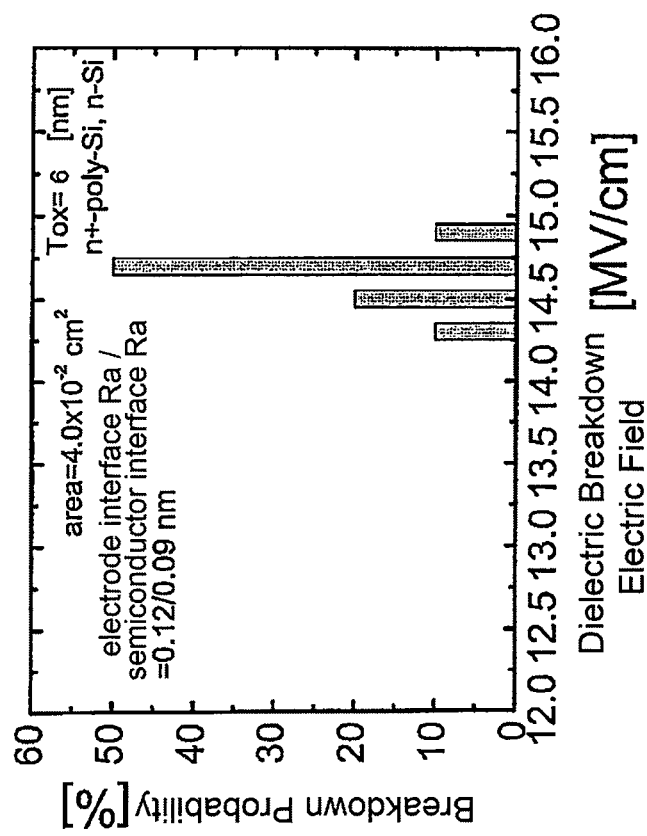
FIG. 11 is a diagram showing the relationship between the dielectric breakdown electric field strength and the breakdown probability of the gate insulating film with an area of $4.0 \times 10^{-2}$ cm$^2$ according to the first embodiment of this invention.

FIG. 10 shows the average roughness Ra and FIG. 11 shows the relationship between the dielectric breakdown electric field strength and the breakdown probability of the gate insulating film with a gate insulating film area (laminated surface area) of $4.0 \times 10^{-2}$ cm$^2$.

FIG. 12 shows the cumulative probability of the life of the gate insulating film with a gate insulating film area of $4.0 \times 10^{-2}$ cm$^2$ when a constant stress current of $+0.1$ A/cm$^2$ was applied thereto.

A semiconductor substrate having a Si semiconductor layer 901 was prepared.

Herein, silicon (Si) was used as the semiconductor layer 901. In this semiconductor substrate, the semiconductor layer 901 was formed on a surface of a Si wafer by an epitaxial method and the plane orientation of a surface of the semiconductor layer 901 was (100).

The semiconductor layer 901 was n-type and had a resistivity of 10 Ω·cm.

In this invention, the resistivity of the semiconductor layer 901 is preferably 8 to 12 Ω·cm.

The base member on which the semiconductor layer 901 was provided was also n-type and had a resistivity of 0.01 Ω·cm.

In this invention, the resistivity of the base member is preferably 0.008 to 0.012 Ω·cm.

In this invention, the polarity of the semiconductor layer 901 may alternatively be p-type and may alternatively be manufactured by a Cz method or a FZ method.

Further, the plane orientation of the semiconductor layer 901 is not limited to (100).

First, a flattening treatment was carried out.

The surface of the semiconductor layer 901 was oxidized, thereby forming an insulating oxide film.

Herein, the oxide film with a thickness of 1 μm was formed on the surface of the semiconductor layer 901 in a mixed atmosphere of water and oxygen at a temperature of 1000° C.

This formed oxide film was removed using a mixed chemical solution of hydrochloric acid and hydrofluoric acid.

By this flattening treatment, the (100) surface of the semiconductor layer 901 had an average roughness of 0.06 nm. The maximum size of asperity in a region of a length of 1 μm in a direction parallel to the surface was 0.6 nm.

In this invention, it is preferable to use, as part of the flattening treatment, a method of immersing the semiconductor substrate in a dilute hydrofluoric acid chemical solution in an environment where light is shielded and the dissolved oxygen concentration of the chemical solution is 1 ppb or less.

Thereafter, the semiconductor layer 901 surface with the average roughness of 0.06 nm thus formed was oxidized by an oxygen radical method, thereby forming a gate insulating film 902.

That is, the gate insulating film 902 was formed by an oxidation method using oxygen radicals as an oxidation species and using a microwave-excited high-density plasma apparatus. The thickness of the formed gate insulating film 902 was 6.0 nm.

It was confirmed that the average roughness of an interface between the semiconductor layer 901 and the gate insulating film 902 and the average roughness of a surface of the formed gate insulating film 902 were maintained at 0.06 nm.

The maximum size of asperity 906 of the semiconductor layer-side interface 904 in this event was 10% of the average thickness of the gate insulating film 902.

After forming the gate insulating film 902, a gate electrode 903 was formed on the surface of the gate insulating film 902 in the following manner.

That is, an amorphous Si film doped with P (phosphorus) at about $3 \times 10^{20}$ cm$^{-3}$ was deposited to a thickness of 150 nm on the gate insulating film 902 using a low-pressure chemical vapor deposition method and then the deposited amorphous Si film was annealed at a temperature of 900° C. for 30 minutes. By this annealing, it was possible to activate P (phosphorus) and to convert the amorphous Si film into n$^+$-type polycrystalline Si.

In this invention, it may be configured to deposit a non-doped amorphous Si film, then to implant P (phosphorus) ions into the amorphous Si film, and then to activate the P (phosphorus) ions to convert the amorphous Si film into n$^+$-type polycrystalline Si.

In this manner, the n$^+$-type polycrystalline Si gate electrode 903 was formed.

In this invention, the polarity of the gate electrode is not limited to n$^+$-type and may be p$^+$-type. Further, as the gate electrode 903, use may be made of a metal such as Ti (titanium), Ta (tantalum), W (tungsten), or Al (aluminum), or a conductive nitride such as TiN (titanium nitride) or TaN (tantalum nitride).

Thereafter, the gate electrode 903 was patterned so that its surface had an area of $4.0 \times 10^{-2}$ cm$^2$.

The voltage withstanding characteristics of the gate insulating film 902 thus formed were measured.

FIG. 11 shows the relationship between the dielectric breakdown electric field strength and the breakdown probability in this event. From FIG. 11, it is seen that the breakdown probability is small (zero) in a range where the dielectric breakdown electric field strength is small (i.e. a range of 14.0 MV/cm or less).

FIG. 12 shows the cumulative probability of the life when a constant stress current of $+0.1$ A/cm$^2$ was applied.

From FIG. 12, it is seen that the cumulative breakdown probability is small in a range where the life is small (i.e. a range of $10^3$ seconds or less).

Second Embodiment

Figure 13:
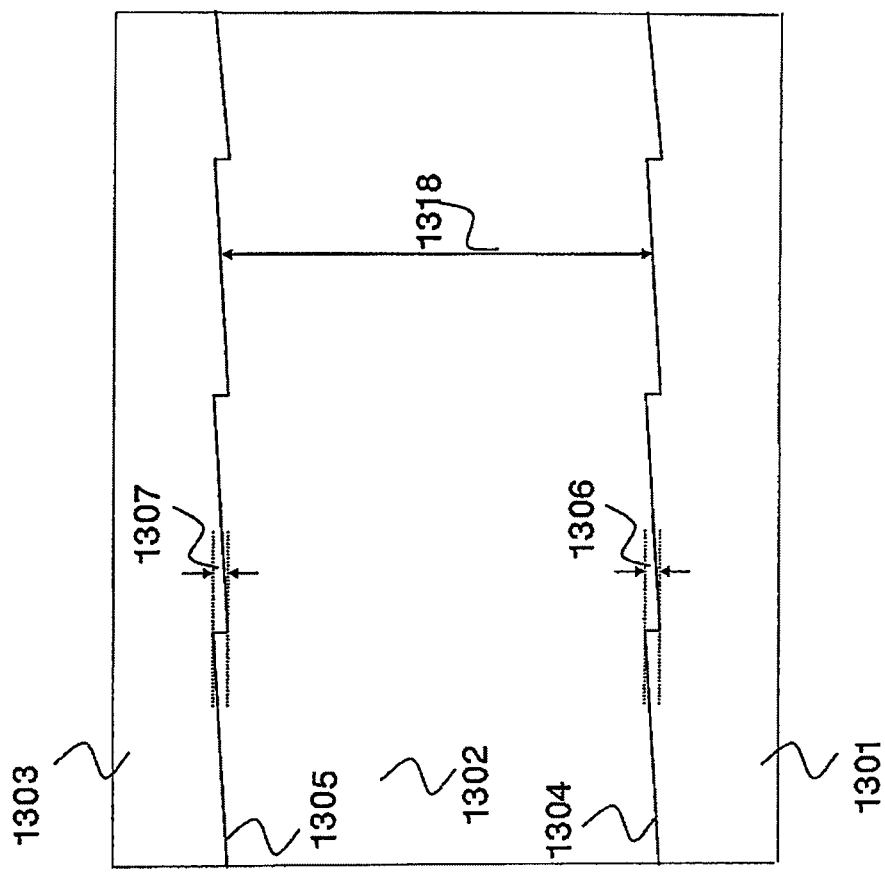
FIG. 13 is an exemplary cross-sectional view for explaining a gate insulating film according to a second embodiment of this invention.

FIG. 13 shows an exemplary cross-sectional view of a gate insulating film according to a second embodiment of this invention.

Figure 14:
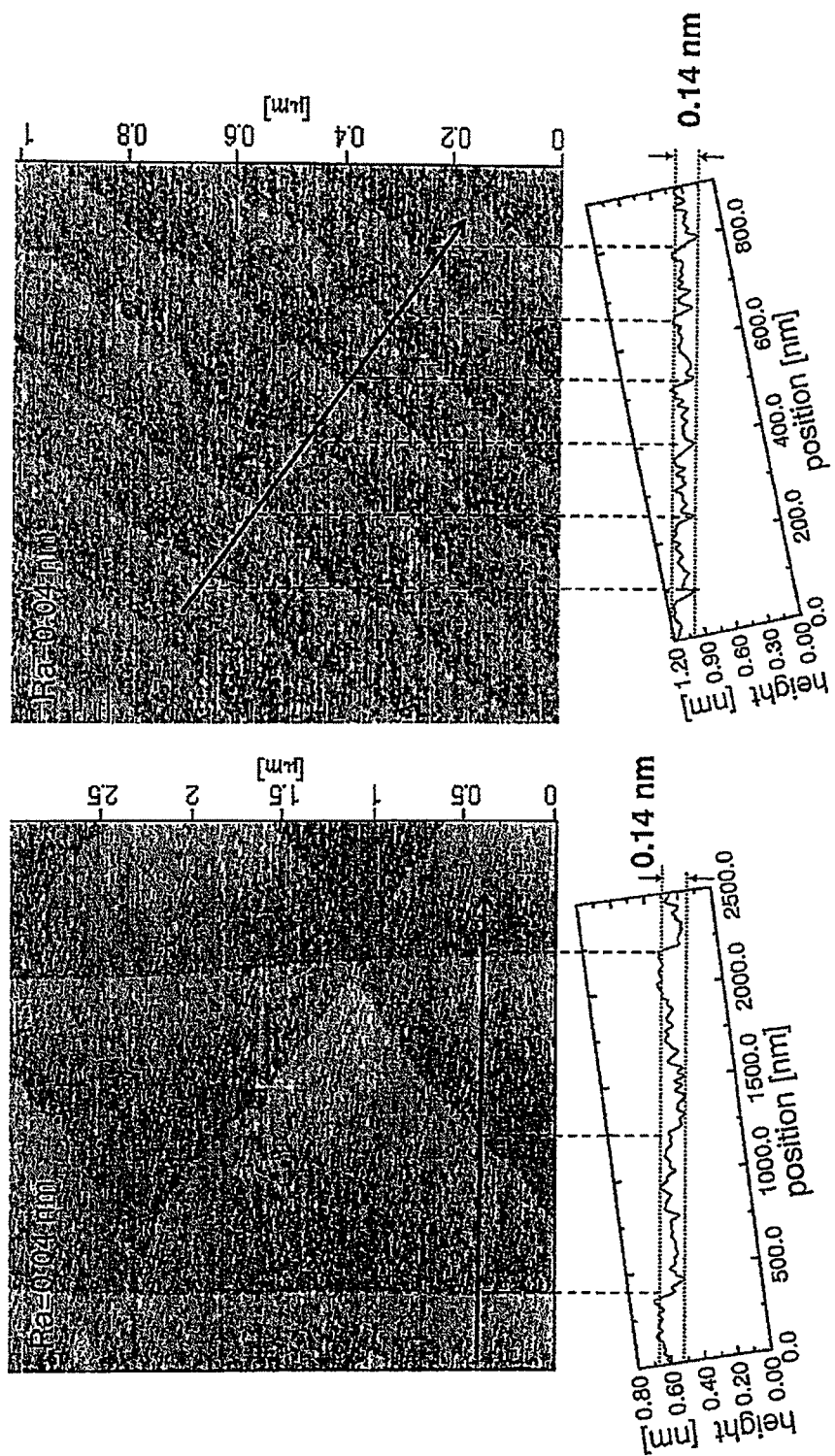
FIG. 14 is diagrams showing atomic force microscopy images and surface height profiles of a semiconductor layer surface after carrying out surface flattening for causing the semiconductor layer surface to have a minimum step between atoms in a plane orientation of the semiconductor layer.

FIGS. 14 (a) and (b) show atomic force microscopy images and surface height profiles of a semiconductor layer surface after a flattening treatment.

Figure 15:
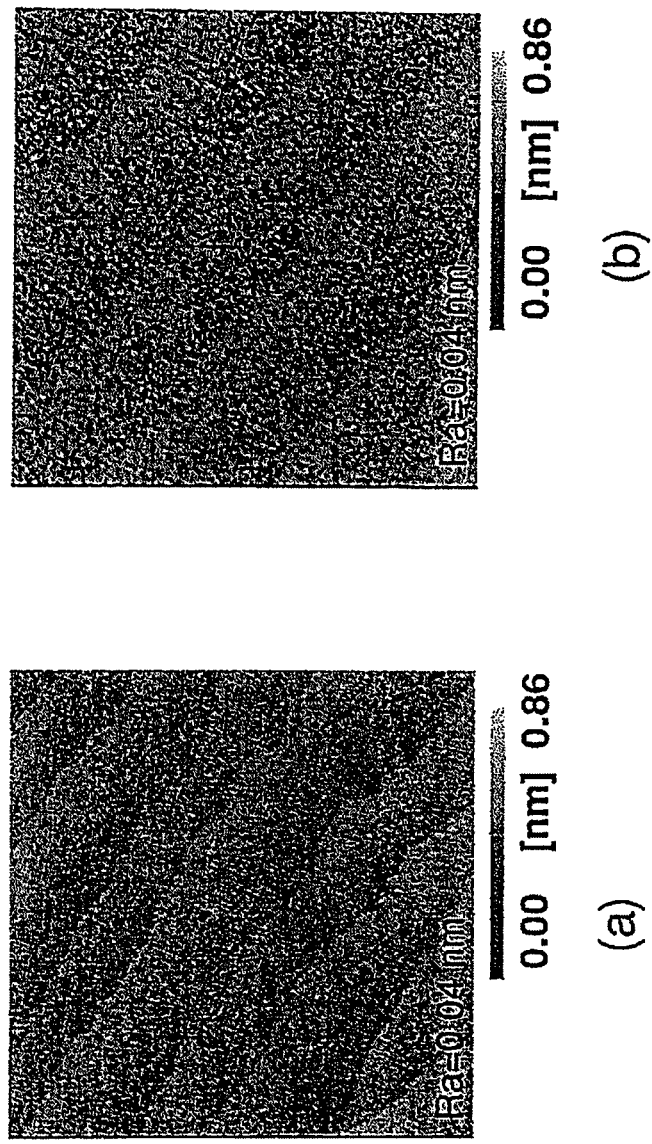
FIG. 15 is diagrams showing atomic force microscopy images of a semiconductor layer-side interface and an insulating film surface of the gate insulating film according to the second embodiment of this invention.

FIG. 15 (a) shows an atomic force microscopy image and average roughness Ra of a semiconductor layer-side interface of the gate insulating film and FIG. 15 (b) shows an atomic force microscopy image and average roughness Ra of a surface of the gate insulating film.

Figure 16:
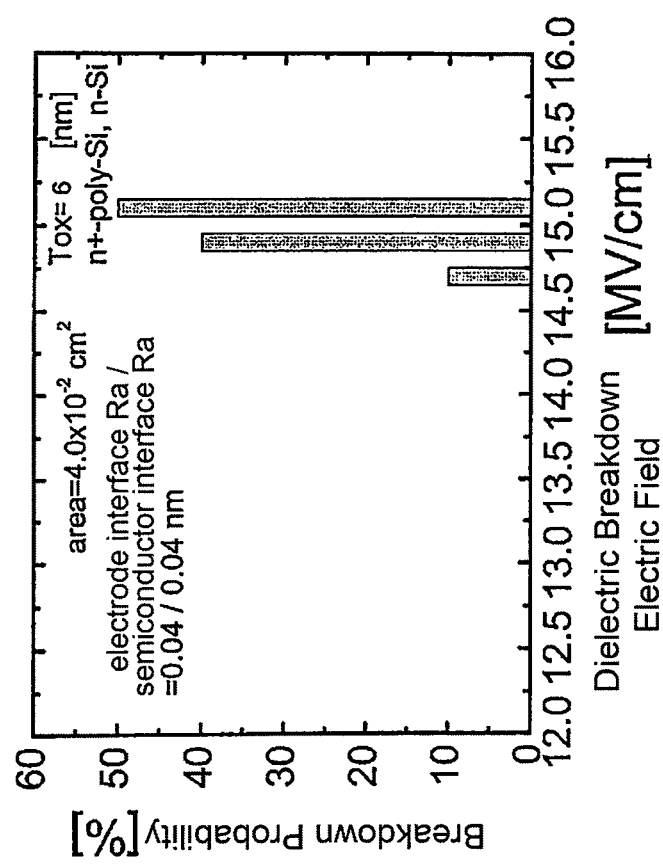
FIG. 16 is a diagram showing the relationship between the dielectric breakdown electric field strength and the breakdown probability of the gate insulating film with an area of $4.0 \times 10^{-2}$ cm$^2$ according to the second embodiment of this invention.

FIG. 16 shows the relationship between the dielectric breakdown electric field strength and the breakdown probability of the formed gate insulating film.

FIG. 17 shows the cumulative probability of the life of the formed gate insulating film when a constant stress current of +0.1 A/cm² was applied thereto.

The same semiconductor substrate as in the first embodiment was used as a semiconductor substrate.

A semiconductor layer was n-type and had a resistivity of 10 Ω·cm.

A base member formed with the n-type semiconductor layer was an n-type Si base member and had a resistivity of 0.01 Ω·cm. First, a surface flattening treatment was carried out to cause the asperity of a preferably Si semiconductor layer surface to be a size of a minimum step between atoms, in a (100) orientation, of a surface of the Si base member.

That is, after removing a natural oxide film of the Si semiconductor layer surface by a dilute hydrofluoric acid chemical solution, a heat treatment was carried out in a highly clean Ar atmosphere under the atmospheric pressure, thereby flattening the Si semiconductor layer surface.

The heat treatment conditions were at 900° C. for 1 hour.

In this invention, an atmosphere during the heat treatment in the flattening treatment may alternatively be $H_2$ (hydrogen) or $Ar/H_2$ (argon/hydrogen).

Further, the pressure during the heat treatment may be lower than the atmospheric pressure.

By this flattening treatment, the (100) surface of the Si semiconductor layer was flattened on an atomic level as shown in FIG. 14.

While the average roughness Ra measured by an atomic force microscope is indicated as 0.04 nm, this is, as described before, the measurement noise level of the atomic force microscope. As is also clear from FIGS. 14 (a) and (b), the asperity in a region of a length of 1 μm in a direction parallel to the surface is 0.14 nm which is the size of the minimum step between atoms in the (100) orientation of the Si semiconductor layer.

Thereafter, on the Si semiconductor layer whose surface was flattened on the atomic level as described above, an insulating oxide film was formed by an oxidation method using oxygen radicals as an oxidation species and using a microwave-excited high-density plasma apparatus, thereby forming a gate insulating film.

The thickness of the gate insulating film in this event was 6 nm.

It was confirmed that the average roughness Ra of an interface between the Si semiconductor layer and the formed gate insulating film (see FIG. 15 (a)) and the average roughness Ra of a surface of the formed gate insulating film (see FIG. 15 (b)), as measured by the atomic force microscope, were maintained at 0.04 nm.

Thereafter, a gate electrode was patterned to have an area of $4.0 \times 10^{-2}$ cm².

FIG. 16 shows the relationship between the dielectric breakdown electric field strength and the breakdown probability of the patterned gate insulating film. As shown in FIG. 16, it is seen that the breakdown probability is small (zero) in a range where the dielectric breakdown electric field strength is small (i.e. a range of 14.5 MV/cm or less).

FIG. 17 shows the cumulative probability of the life of the patterned gate insulating film when a constant stress current of +0.1 A/cm² was applied thereto. From FIG. 17, it is seen that the cumulative breakdown probability is small in a range where the life is small (a range of $2 \times 10^3$ seconds or less).

Third Embodiment

Figure 18:
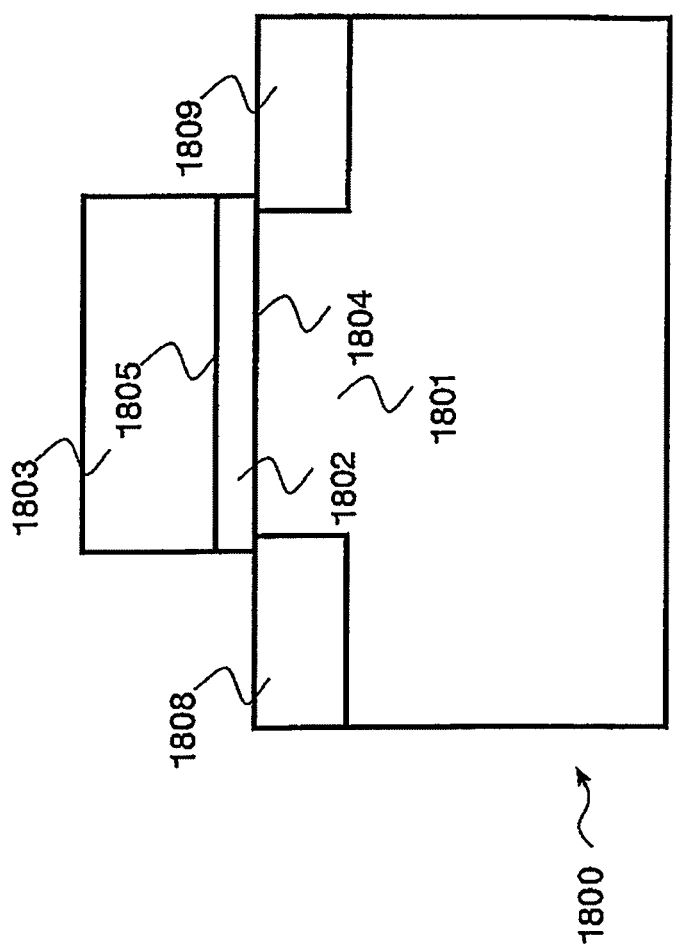
FIG. 18 is an exemplary structural view for explaining a MOS transistor according to a third embodiment of this invention.

FIG. 18 shows a cross-sectional structural view of a MOS transistor according to a third embodiment of this invention. Herein, a description will be given of an n-channel MOS transistor having the gate insulating film described in the first or second embodiment. However, it may alternatively be a p-channel MOS transistor.

In the case of an n-channel MOS transistor 1800 shown in FIG. 18, B (boron) is used as a main impurity of a Si semiconductor layer 1801 near an interface 1804 with a gate insulating film 1802.

A gate electrode 1803 is formed on the gate insulating film 1802 so that an interface 1805 is formed between the gate insulating film 1802 and the gate electrode 1803. As in the second embodiment, the average roughness of the interface 1804 between the semiconductor layer 1801 and the gate insulating film 1802 is reflected as it is on the average roughness of the surface of the gate insulating film 1802.

After forming the gate electrode 1803, ion implantation of As (arsenic) ions was carried out under conditions of 20 keV and $2 \times 10^{15}$ cm⁻² to form a source region 1808 and a drain region 1809. Thereafter, annealing was carried out at a temperature of 1000° C. for 5 seconds, thereby activating the As (arsenic) ions.

The ion implantation conditions may be adjusted to achieve a target depth of an n⁺-layer for source and drain regions to be formed.

Herein, an ion species to be implanted may be cluster ions containing As (arsenic). Alternatively, an ion species to be implanted may be P (phosphorus) ions. The MOS transistor according to this embodiment had the same effect as in the first or second embodiment with respect to the dielectric breakdown electric field and the life of the gate insulating film.

Further, the occurrence of variation was not substantially observed in the electric field applied to the channel formed in the semiconductor layer.

Fourth Embodiment

Figure 19:
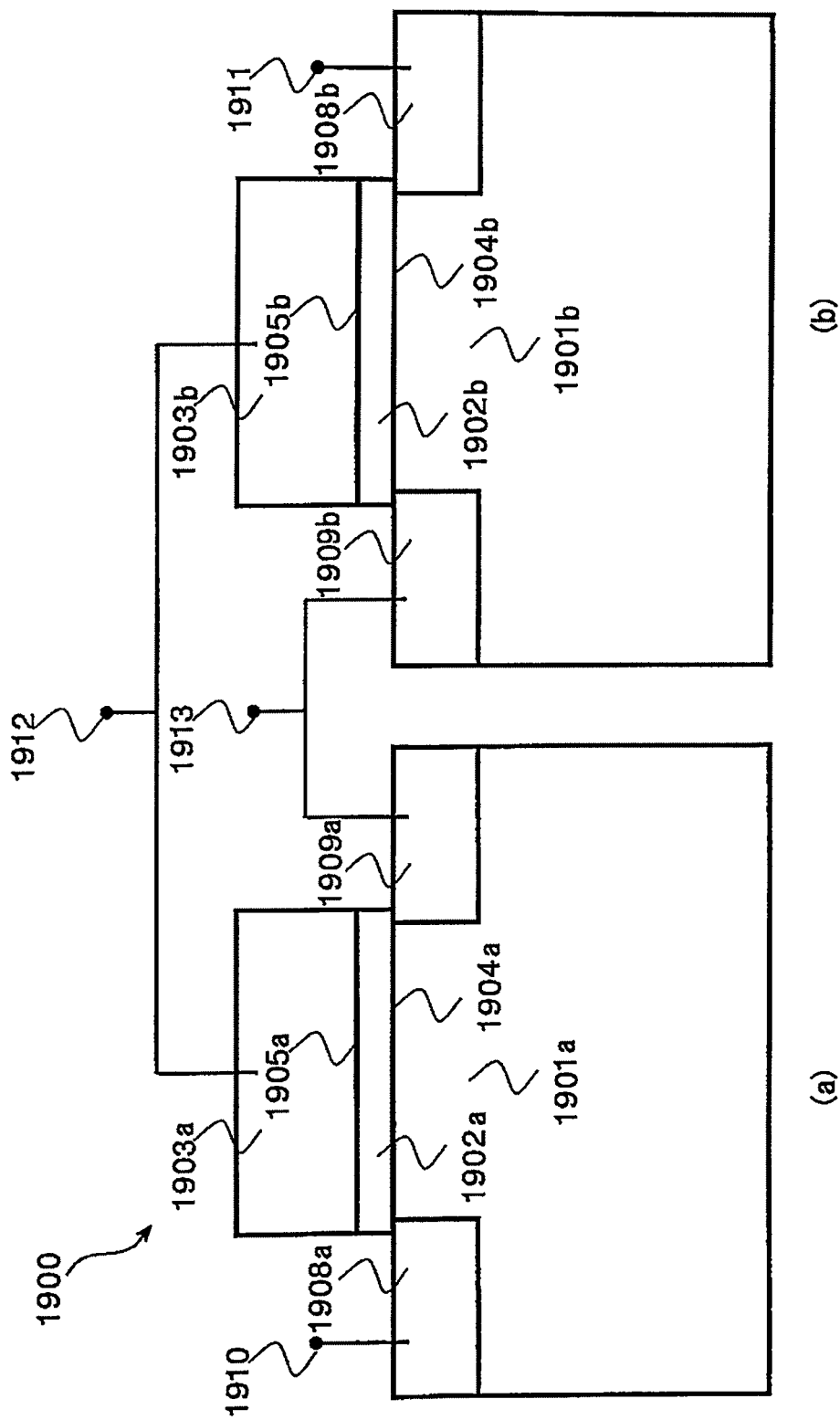
FIG. 19 is an exemplary cross-sectional structural view for explaining a CMOS circuit according to a fourth embodiment of this invention.

FIG. 19 shows an exemplary cross-sectional structural view of a CMOS circuit according to a fourth embodiment of this invention.

A CMOS circuit 1900 is a CMOS inverter circuit in which the n-channel MOS transistor described in the third embodiment (left-side transistor: "(a) in FIG. 19") and a p-channel MOS transistor (right-side transistor: "(b) in FIG. 19") are connected in series to each other.

A source region 1908a of the n-type MOS transistor (a) is connected to a ground terminal 1910.

A source region 1908b of the p-type MOS transistor (b) is connected to a power terminal 1911.

A gate electrode 1903a of the n-type MOS transistor (a) and a gate electrode 1903b of the p-type MOS transistor (b) are respectively connected to an input terminal 1912.

Drain regions 1909a and 1909b are respectively connected to an output terminal 1913.

A gate insulating film 1902a of the n-type MOS transistor, a gate insulating film 1902b of the p-type MOS transistor, and interfaces 1904a, 1904b, 1905a, and 1905b were formed in the same manner as in the third embodiment.

The CMOS circuit according to this embodiment had the same effect as in the first or second embodiment with respect to the dielectric breakdown electric field and the life of the gate insulating films.

Further, the occurrence of variation was not substantially observed in the electric field applied to each of channels formed in semiconductor layers.

Fifth Embodiment

Figure 20:
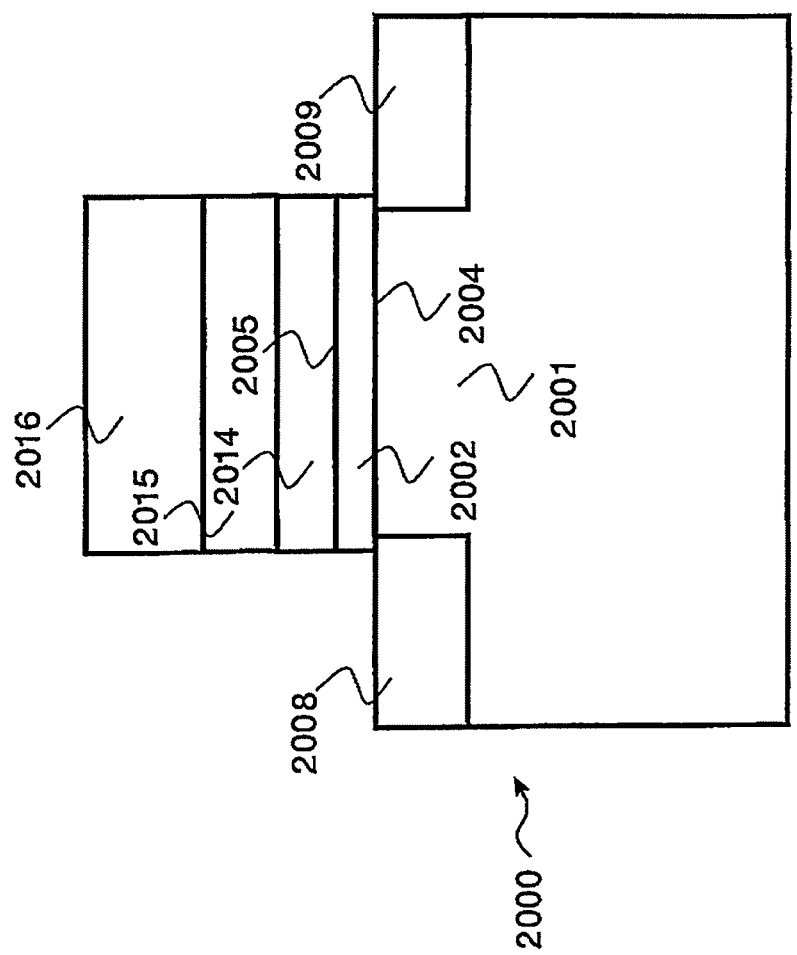
FIG. 20 is an exemplary structural view for explaining a semiconductor memory according to a fifth embodiment of this invention.

FIG. 20 shows an exemplary cross-sectional view of a semiconductor memory comprising a floating gate transistor according to a fifth embodiment of this invention.

In a semiconductor memory 2000 shown in FIG. 20, the structures of a gate insulating film 2002 and a floating gate electrode 2014 are the same as those in the n-channel MOS transistor described in the third embodiment.

The semiconductor memory 2000 has a structure in which an interelectrode insulating film 2015 and a control gate electrode 2016 are laminated in this order on the floating gate electrode 2014.

Further, a source region 2008 and a drain region 2009 are also provided.

The semiconductor memory 2000 according to this embodiment had the same effect as in the first or second embodiment with respect to the dielectric breakdown electric field and the life of the gate insulating film.

Variation in current supplied from the source region 2008 to the drain region 2009 through the gate insulating film 2002 at the time of writing was suppressed. This might be because variation in electric field applied to the gate insulating film 2002 was suppressed.

Since variation in current supplied through the gate insulating film 2002 was suppressed, variation in stress-induced leakage current, which would cause a write failure or a read failure, was also suppressed.

The semiconductor memory 2000 (floating gate transistor) according to the fifth embodiment was proved to be a highly reliable semiconductor memory in which write and read failures were suppressed.

INDUSTRIAL APPLICABILITY

This invention is applicable to an insulating film, a MOS capacitor, a MOS transistor, a CMOS circuit and a semiconductor memory circuit each employing at least one of them, and their manufacturing methods.

DESCRIPTION OF SYMBOLS 101, 501, 901, 1301 semiconductor layer
102, 502, 902, 1302, 1802, 1902a, 1902b gate insulating film
103, 503, 903, 1303, 1803, 1903a, 1903b gate electrode
104, 504, 904, 1304, 1804, 1904a, 1904b semiconductor layer-side interface
105, 505, 905, 1305, 1805, 1905a, 1905b electrode-side interface
106, 506, 906, 1306 asperity of semiconductor layer-side interface
107, 507, 907, 1307 asperity of electrode-side interface
118, 518, 918, 1318 thickness of gate insulating film
1800 n-channel MOS transistor
1808 source region
1809 drain region
1900 CMOS inverter circuit
1910 ground terminal
1911 power terminal
1912 input terminal
1913 output terminal
2000 semiconductor memory
2014 floating gate electrode
2015 interelectrode insulating film
2016 control gate electrode

The invention claimed is:

1. A semiconductor device comprising:
a semiconductor layer;
a gate insulating film in contact with the semiconductor layer with an interface formed therebetween; and
a gate electrode layer in contact with the insulating film with an interface formed therebetween on a side opposite to the semiconductor layer,
wherein asperity of the interface between the semiconductor layer and the gate insulating film and asperity of the interface between the gate insulating film and the gate electrode layer each have a size which decreases correspondingly as a thickness of the gate insulating film decreases in a region of a length of 1 μm in a direction parallel to a direction in which the gate insulating film extends;
wherein the size of the asperity of the interface between the semiconductor layer and the gate insulating film is 10% or less of the thickness of the gate insulating film and the size of the asperity of the interface between the gate insulating film and the gate electrode layer is 10% or less of the thickness of the gate insulating film.

2. The semiconductor device according to claim 1, wherein the asperities of both interfaces are each a minimum step between atoms in a plane orientation of the semiconductor layer.

3. A method of manufacturing a semiconductor device comprising:
a semiconductor layer;
a gate insulating film in direct contact with the semiconductor layer; and
a gate electrode in direct contact with the gate insulating film on a side opposite to the semiconductor layer,
the method comprising as its steps:
a flattening step of causing a size of asperity of a surface of the prepared semiconductor layer to be 10% or less of a thickness of the gate insulating film to be formed; and
a gate insulating film forming step of forming the gate insulating film by oxidation, oxynitriding, or nitriding method which renders a size of asperity of an interface between the semiconductor layer and the gate insulating film contacted with each other into 10% or less of the thickness of the gate insulating film and which renders a size of asperity of a surface of the gate insulating film and the electrode into 10% or less of the thickness of the gate insulating film to be formed.

4. The method of manufacturing a semiconductor device according to claim 3,
wherein the flattening step comprises a flattening step of rendering the asperity of the surface of the semiconductor layer to a minimum step between atoms in a plane orientation of the semiconductor layer, and
wherein the gate insulating film forming step comprises a step of forming the gate insulating film by the oxidation, oxynitriding, or nitriding method so that the size of the asperity of the interface between the semiconductor layer and the gate insulating film contacted with each other and the size of the asperity of the surface of the gate insulating film to which the gate electrode is to be provided, each become equal to or substantially equal to a size of the step.

5. The method of manufacturing a semiconductor device according to claim 3, wherein the flattening step comprises a step of forming an oxide film on the prepared semiconductor layer in an atmosphere of water or oxygen or in an atmosphere of a mixture of water and oxygen at a temperature of 900° C. or more and removing the formed oxide film using a chemical solution containing hydrofluoric acid.

6. The method of manufacturing a semiconductor device according to claim 3, wherein the flattening step comprises a step of heat-treating the prepared semiconductor layer in an atmosphere of Ar, $H_2$, or Ar/$H_2$ at a temperature of 800° C. or more after removing a natural oxide film of its surface.

7. A semiconductor device comprising:
a semiconductor layer;
a gate insulating film in direct contact with the semiconductor layer; and
a gate electrode in direct contact with the gate insulating film on a side opposite to the semiconductor layer,
wherein a thickness of the gate insulating film, asperity of an interface between the semiconductor layer and the gate insulating film, and asperity of an interface between the gate insulating film and the gate electrode are formed so that a size of the asperity of the interface between the semiconductor layer and the gate insulating film is reflected on a size of the asperity of the interface between the gate insulating film and the gate electrode;
wherein the size of the asperity of the interface between the semiconductor layer and the gate insulating film is 10% or less of the thickness of the gate insulating film and the size of the asperity of the interface between the gate insulating film and the gate electrode layer is 10% or less of the thickness of the gate insulating film.

* * * * *